United States Patent
Tomanovich

[11] Patent Number: 5,865,321
[45] Date of Patent: Feb. 2, 1999

[54] SLIP FREE VERTICAL RACK DESIGN

[75] Inventor: John A. Tomanovich, Paxton, Mass.

[73] Assignee: Saint-Gobain/Norton Industrial Ceramics Corp., Worcester, Mass.

[21] Appl. No.: 903,267

[22] Filed: Jul. 25, 1997

Related U.S. Application Data

[63] Continuation of Ser. No. 435,931, May 5, 1995, abandoned.

[51] Int. Cl.[6] .................................................. A47F 29/00
[52] U.S. Cl. ............................... 211/40; 211/45; 211/55; 211/71; 206/454; 432/258
[58] Field of Search .................................. 211/40, 71, 45, 211/55; 432/258, 121; 206/454

[56] References Cited

U.S. PATENT DOCUMENTS

| | | | |
|---|---|---|---|
| 3,756,581 | 9/1973 | Albertini | 211/41 X |
| 3,964,957 | 6/1976 | Walsh | 156/345 |
| 4,153,164 | 5/1979 | Hofmeister et al. | 211/41 |
| 4,203,940 | 5/1980 | Dietze et al. | 264/154 |
| 4,228,902 | 10/1980 | Schulte | 432/258 X |
| 4,412,812 | 11/1983 | Sadowski et al. | 432/121 |
| 4,504,224 | 3/1985 | Hewitt | 432/258 |
| 4,569,452 | 2/1986 | Sculke | 211/41 X |
| 4,911,308 | 3/1990 | Nylund | 211/41 |
| 4,949,848 | 8/1990 | Kos | 211/41 |
| 5,178,639 | 1/1993 | Nishi | 29/25.02 |
| 5,188,240 | 2/1993 | Marino et al. | 211/41 |
| 5,199,577 | 4/1993 | Curtis | 211/41 X |
| 5,219,079 | 6/1993 | Nakamura | 211/41 |
| 5,310,339 | 5/1994 | Ushikawa | 432/258 X |
| 5,316,472 | 5/1994 | Niino et al. | 432/258 X |
| 5,393,226 | 2/1995 | Groom | 432/258 |
| 5,431,561 | 7/1995 | Yamabe et al. | 432/253 |
| 5,492,229 | 2/1996 | Tanaka et al. | 211/41 |
| 5,503,173 | 4/1996 | Kudo et al. | 134/201 |
| 5,507,873 | 4/1996 | Ishizuka et al. | 432/253 X |
| 5,515,979 | 5/1996 | Salvail | 211/41 X |
| 5,534,074 | 7/1996 | Koons | 211/41 X |
| 5,560,499 | 10/1996 | Dardashti | 211/41 X |
| 5,586,880 | 12/1996 | Ohsawa | 432/258 X |
| 5,618,351 | 4/1997 | Koble, Jr. et al. | 432/258 X |
| 5,679,168 | 10/1997 | Porter et al. | 432/258 X |

FOREIGN PATENT DOCUMENTS

| | | | |
|---|---|---|---|
| 106919 | 5/1984 | European Pat. Off. | 432/258 X |
| 6-349758 | 12/1994 | Japan . | |

*Primary Examiner*—Daniel P. Stodola
*Assistant Examiner*—Bruce A. Lev
*Attorney, Agent, or Firm*—Thomas M. DiMauro

[57] ABSTRACT

Vertical rack for supporting semiconductor wafers, the rack having either continuously upward angled arms or horizontal arms for providing near center support of the wafers.

2 Claims, 4 Drawing Sheets

SLIP FREE VERTICAL RACK DESIGN

This application is a continuation of application Ser. No. 08/435,931, filed May 5, 1995, now abandoned.

BACKGROUND OF THE INVENTION

The manufacture of semiconductor devices such as integrated circuits (IC's) typically requires heat treating silicon wafers in the presence of reactive gases. During this process, the temperatures and gas concentrations to which the devices are exposed must be carefully controlled, as the devices often include circuitry elements less than 1 um in size which are sensitive to minute variations in the processing environment.

The semiconductor manufacturing industry typically processes the wafers in either horizontal or vertical carriers. The horizontal carrier, typically called a "boat", has three or four horizontally disposed bars arranged in a semicircle design, with each bar having inwardly facing grooves set therein at regular intervals. Each set of grooves define a vertical space for carrying a vertically disposed wafer.

The vertical carrier, typically called a "vertical rack", has three or four vertically disposed rods arranged in a semicircle design, with each post having slots set therein at regular intervals to define a space for carrying a horizontally disposed wafer. A conventional vertical rack is shown in FIG. 1. This rack typically has a top plate, a bottom plate, and three or four posts for fixing the top plate to the bottom plate. The portions of the post between each slot, termed "teeth", are identically spaced in order to support wafers at regular intervals from and parallel to the bottom plate. The entire rack is then placed within a vertical furnace for processing the wafers. Because a wafer processed on a vertical rack experiences less of a temperature gradient over its face, semiconductor manufacturers are increasingly turning to vertical furnaces. There is, however, a drawback to vertical furnacing. As shown in prior art FIG. 1, the wafers disposed on a conventional vertical rack are supported at their outside edge only. As such, the areas of the wafer resting on these teeth experience higher stress than the rest of the wafer. When temperatures in the furnace exceed about 1000° C., these stresses often become significant and portions of the single crystal wafer move relative to each other along crystallographic plates in response to that stress. This phenomenon, called "slip", effectively destroys the value of the semiconductor devices located in the area of the wafer where slip has occurred.

Therefore, there is a need for a vertical rack design which alleviates slip.

SUMMARY OF THE INVENTION

In accordance with the present invention, there is provided a vertical rack for supporting a plurality of semiconductor wafers in a spaced, substantially horizontal, parallel relation, the vertical rack comprising:
a) a vertical support means, and
b) a plurality of vertically spaced, horizontal support means extending substantially horizontally from the vertical support means to define a plurality of support levels for supporting the wafers,
wherein the innermost contact between the horizontal support means of each support level and its supported wafer is in the region of between 20% and 80% of the wafer radius, measured from the edge of the wafer.

In some embodiments, the vertical rack comprises:
a) a top plate,
b) a bottom plate, and
c) a plurality of vertical rods, the upper end of each rod being fixed about the periphery of the top plate and the lower end of each rod being fixed about the periphery of the bottom plate, each of the rods having a plurality of projections spaced equidistantly from the bottom plate to define a plurality of support levels for horizontally supporting the wafers,
wherein the innermost contact between at least one of the projections of each support level and its supported wafer is in the region of between 20% and 80% of the wafer radius, measured from the edge of the wafer.

In a first preferred embodiment (as in FIG. 2), each projection comprises an arm terminating in a wafer platform and the wafers are supported solely by the wafer platforms. The innermost contact between each wafer platform and the supported wafer is in the region of between 20% and 80% of the wafer radius, measured from the edge of the wafer. Preferably, the arm projects at a continuous upward incline and the wafer platform is horizontal. More preferably, the projections are oriented in such a manner that the rods cast a shadow upon no more than 30% of the wafer, most preferably no more than 10% of the wafer.

In a second preferred embodiment (as in FIG. 3), each projection consists of an arm projecting horizontally to continuously contact the wafer from the wafer edge such that the innermost contact between the arm and the wafer is in the region between 20% and 80% of the wafer radius, measured from the wafer radius. Preferably, the projections are oriented in such a manner that the rods cast a shadow upon no more than 30% of the wafer, most preferably no more than 10% of the wafer.

DETAILED DESCRIPTION OF THE INVENTION

Figure 2A:
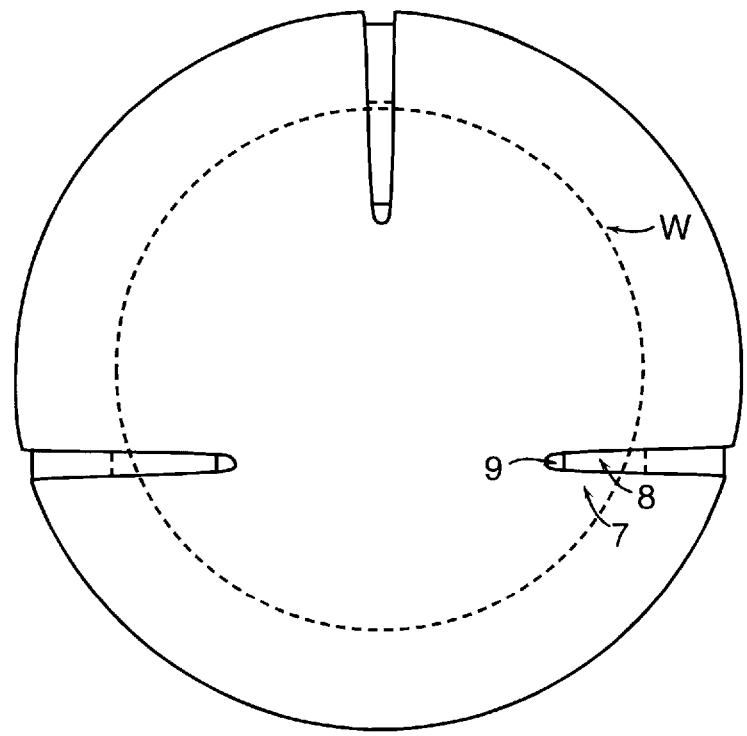
FIGS. 2a and 2b are a top view and a side view of a vertical rack of the present invention having projections comprising an arm terminating in a wafer platform.
Figure 2B:
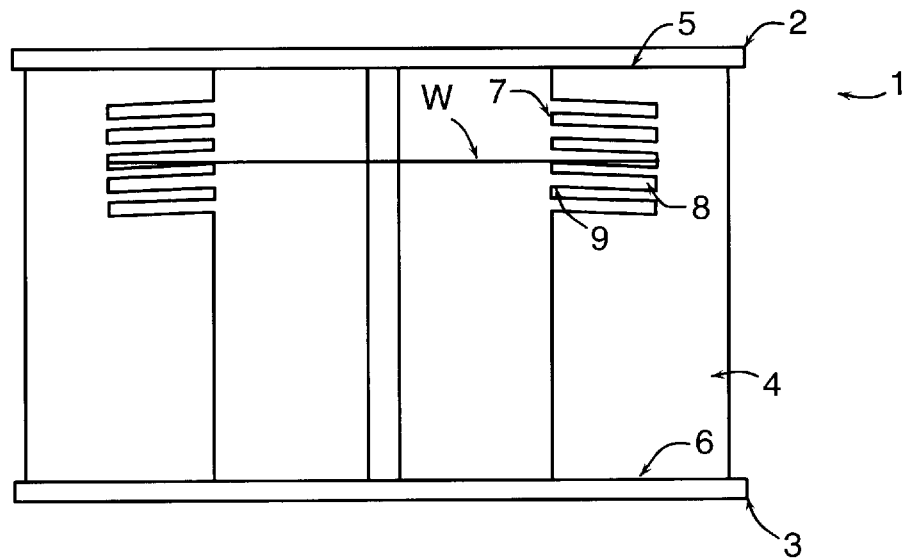

Referring now to FIG. 2, there is provided a vertical rack 1 for processing semiconductor wafers W comprising:
a) a top plate 2,
b) a bottom plate 3, and
c) a plurality of vertical rods 4, the upper end 5 of each rod being fixed about the periphery of the top plate 2 and the lower end 6 of each rod being fixed about the periphery of the bottom plate 3, each of the rods having a plurality of projections 7 spaced equidistantly from the bottom plate 3 to define a plurality of support levels for horizontally supporting the wafers W,
wherein each projection 7 comprises an arm 8 terminating in a wafer platform 9 such that the innermost contact between the wafer platform and the wafer is in the region of between 20% and 80% of the wafer radius, measured from the edge of the wafer.

Figure 1:
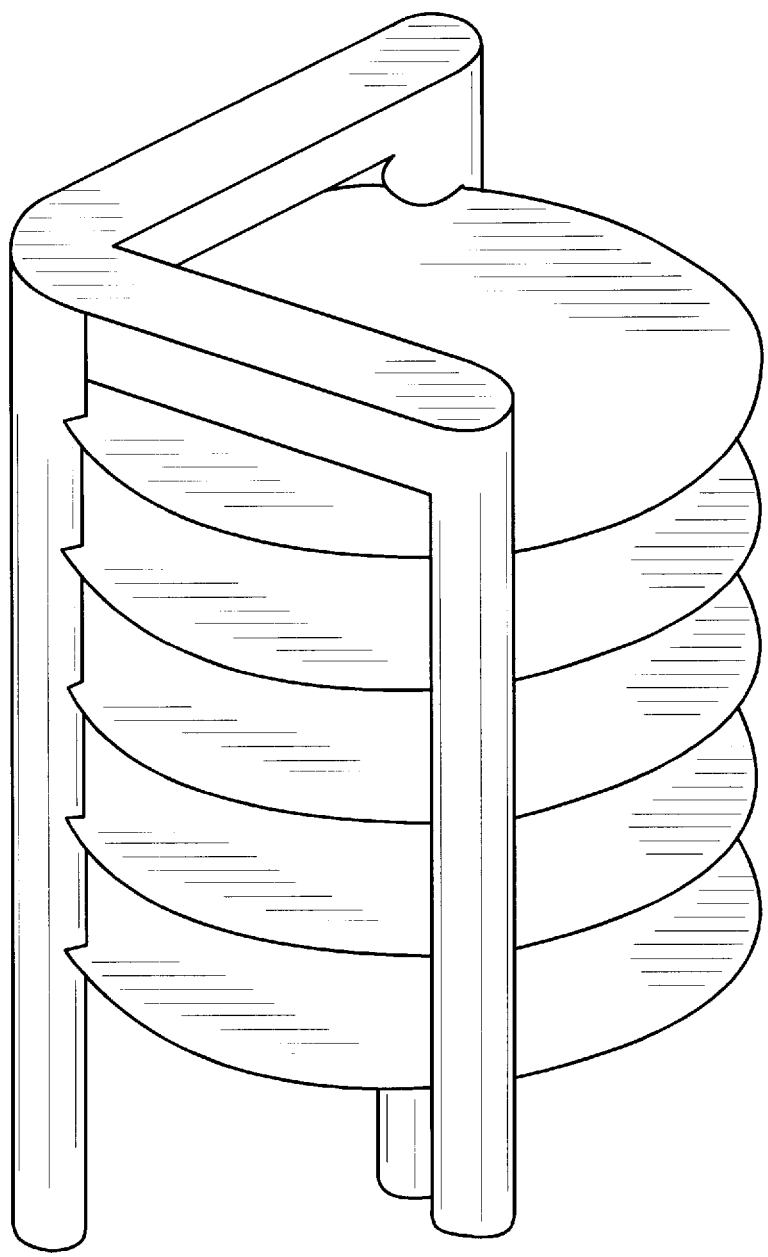
FIG. 1 is a conventional vertical rack design.

Preliminary testing of the design shown in FIG. 2 has shown that it solves the slip problem. Without wishing to be tied to a theory, it is believed that providing only peripheral edge-support to a wafer (as in FIG. 1) causes significant stresses which contribute to slip. The present invention (as embodied in FIG. 2) mitigates the stresses by providing support closer to the center of the wafer.

The continuous incline of the first embodiment is typically between about 0.5 and about 10 degrees from the horizontal. The wafer platform of this embodiment is typically positioned to contact the wafer such that the innermost contact between at least one and preferably each of at least three of the wafer platforms and their supported wafer is in the region of between 20% and 80% of the wafer radius (measured from the edge of the wafer), and preferably between 33% and 66% of the wafer radius. The total surface area of the wafer platforms at one support level is typically between about 0.02% and about 1% of the surface area of the wafer.

Figure 3A:
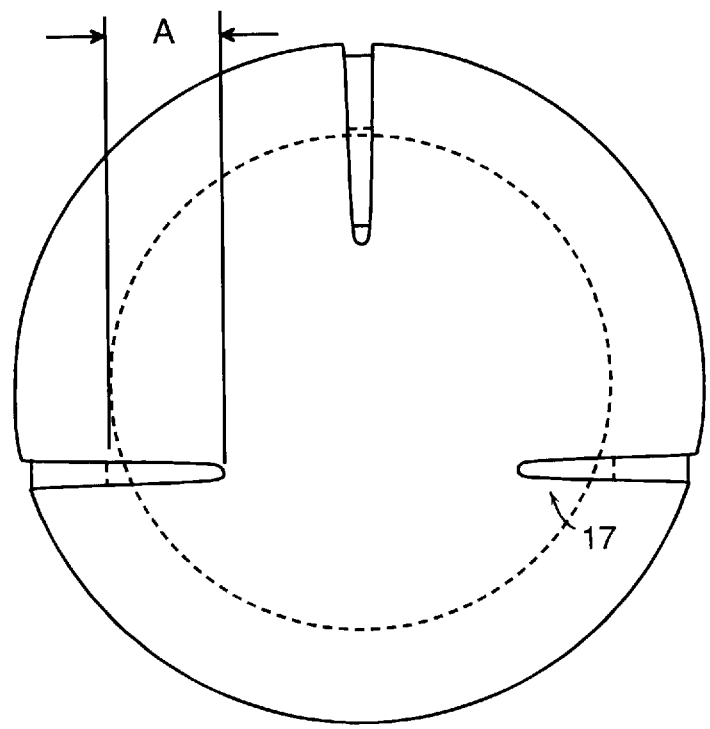
FIGS. 3a and 3b are a top view and a side view of a vertical rack of the present invention having horizontal arms.
Figure 3B:
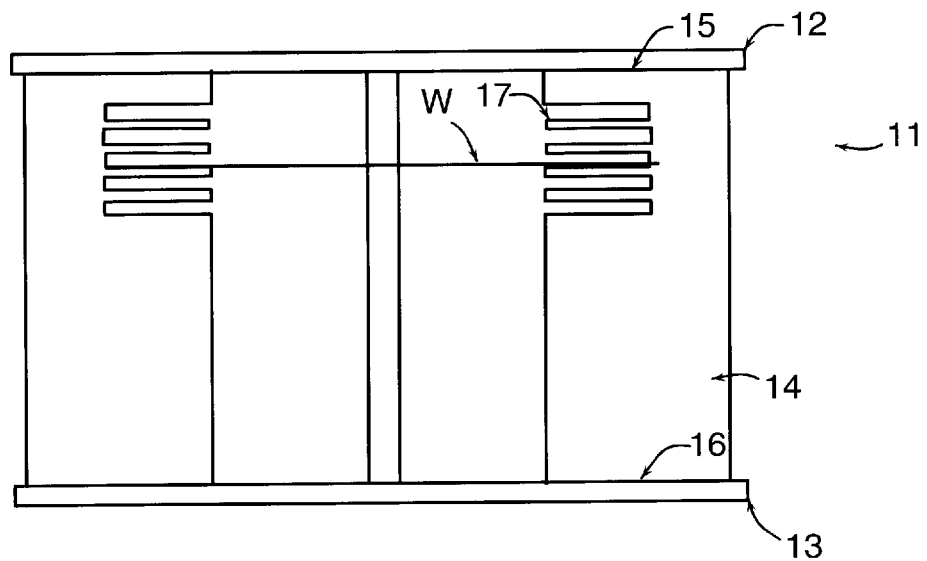

Referring now to FIG. 3, there is provided a vertical rack 11 for processing semiconductor wafers comprising:

a) a top plate 12, b) a bottom plate 13, and c) a plurality of vertical rods 14, the upper end 15 of each rod being fixed about the periphery of the top plate 12 and the lower end 16 of each rod being fixed about the periphery of the bottom plate 13, each of the rods having a plurality of projections 17 spaced equidistantly from the bottom plate 13 to define a plurality of support levels for horizontally supporting the wafers W, wherein each projection 17 consists of an arm projecting horizontally to continuously contact the wafer W from the wafer edge such that the innermost contact between the arm and the wafer is in the region between 20% and 80% of the wafer radius, measured from the wafer radius.

The embodiment of the present invention described by FIG. 3 differs from that of FIG. 2 in that its arms are horizontal. Since horizontal arms require less vertical space than inclined arms, more wafers can be processed in a rack having this design than in a rack of similar height having inclined arms. Moreover, this rack is easier to construct because it does not require a separate machining step to make the wafer platform of the inclined arm embodiment.

In the second preferred embodiment, the innermost contact between at least one and preferably each of at least three of the arms and their supported wafer is in the region of between about 20% and 80%, and preferably between 33% and 66% of the wafer radius. Moreover, the total contact area between the arms at one support level and their supported wafer is typically between about 1% and about 5% of the surface area of the wafer.

To minimize slip-inducing stress, the surfaces of the projections upon which the wafers rest (i.e, either the wafer platforms or horizontal arms) should be both coplanar and smooth. For example, the surfaces of the projections at a support level should be coplanar to within about 0.05 mm as defined in Section 6.5.6 of ASME National Standard Y14.5M-1994. Each should be smooth to within about 1 micron (um) $R_a$, as defined by Section 3.9.1 of ANSI/ASME National Standard B46.1-1985.

The distance which the projections typically extend from the rod of the vertical rack (found by measuring the shortest distance between the end of the projection and the rod and shown as "A" in FIG. 3) is generally dependent upon the size of the wafer to be processed. For example, when the wafer to be processed has a 150 mm diameter, the projections typically extend at least 17 mm, usually between about 22 mm and about 42 mm, and preferably about 29 mm. When the wafer to be processed has a 200 mm diameter, the projections typically extend at least 24 mm, usually between about 32 mm and about 52 mm, and preferably about 38 mm. When the wafer to be processed has a 300 mm diameter, the projections typically extend at least 32 mm, usually between about 42 mm and about 72 mm, and preferably about 56 mm.

The vertical rack of the present invention can be made from any material commonly used in the high temperature production of vertical racks for semiconductor processing, preferably recrystallized silicon carbide. The rack material may also be CVD coated with refractory materials such as silicon carbide, silicon nitride or diamond. Preferably, the rack comprises CRYSTAR, a recrystallized silicon carbide available from the Norton Company of Worcester, Mass.

Figure 4A:
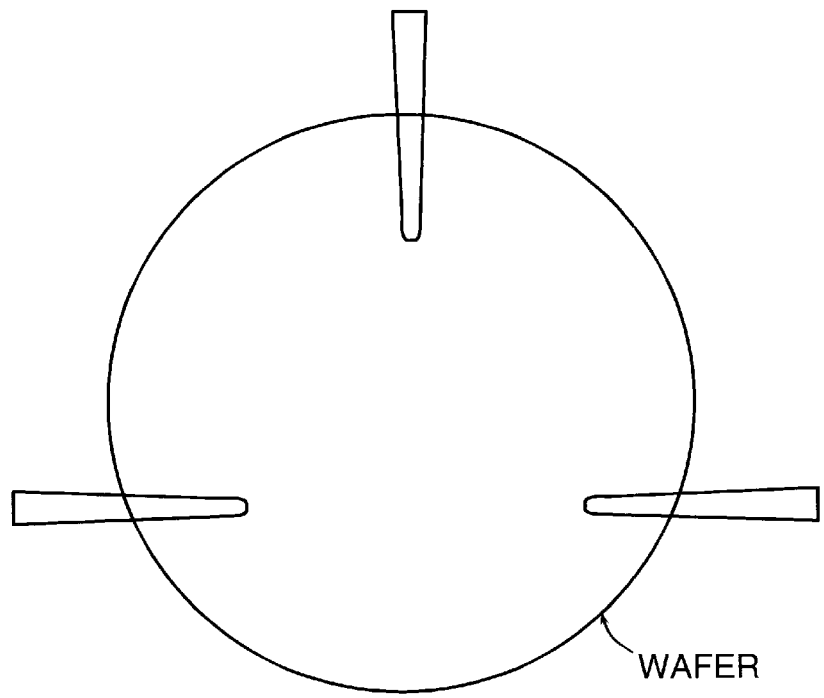
FIGS. 4a and 4b depict the shadow produced by the rods of FIGS. 2 and 3 upon a typical wafer.
Figure 4B:
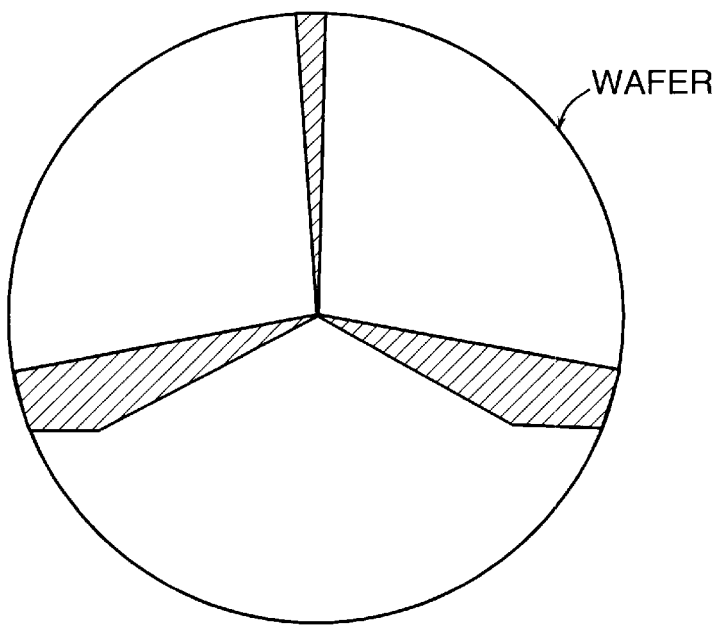

It has been observed that the rods of vertical racks typically shield, or "shadow", radiant heat and/or reactive gases (which enter from the periphery of the vertical furnace) from the portions of the wafer inside of and adjacent to the posts. Accordingly, significant variations in temperature and/or gas concentration between the "shadowed" portion of the wafer and the rest of the wafer are produced. These variations contribute to slip-inducing stress. Therefore, in some embodiments, the projections are radially oriented such that the rods cast a shadow on no more than 30% of the wafer, preferably no more than 10% of the wafer. For the purposes of the present invention, the shadow percentage is calculated by determining the percentage of the wafer face to which reactant gases and/or heat can directly radially proceed from the rack periphery in a path unobstructed by the rods. The shaded portion of FIG. 4b represents the shadow produced by the rods of FIGS. 2a and 3a upon the wafers.

What is claimed is:

1. A combination comprising a) a plurality of semiconductor wafers in a spaced, substantially horizontal, parallel relation, each wafer having a centerpoint and a radius, and b) a vertical rack comprising:

i) a vertical support means for supporting the wafers in a vertical orientation, and ii) a plurality of vertically spaced, horizontal support means extending substantially horizontally from the vertical support means to define a plurality of support levels for supporting the wafers, wherein each horizontal support means consists of at least three arms, each arm projecting horizontally to continuously contact the wafer from the wafer radius, thereby defining a point of innermost contact between the arm and its supported wafer, measured from the radius of the wafer, such that at least one point of innermost contact at each support level is in the region between 20% and 80% of the wafer radius, and wherein the points of innermost contact define a center of gravity located substantially at the centerpoint of the wafer, thereby evenly supporting the wafer.

2. The combination of claim 1 wherein each point of innermost contact is in the region between 33% and 66% of the wafer radius, and wherein the points of innermost contact define a center of gravity located at the centerpoint of the wafer.

* * * * *